United States Patent [19]

Adan

[11] Patent Number: 5,210,429
[45] Date of Patent: May 11, 1993

[54] STATIC RAM CELL WITH CONDUCTIVE STRAPS FORMED INTEGRALLY WITH THIN FILM TRANSISTOR GATES

[75] Inventor: Alberto O. Adan, Tenri, Japan

[73] Assignee: Sharp Kabushiki Kaisha, Osaka, Japan

[21] Appl. No.: 917,682

[22] Filed: Jul. 22, 1992

Related U.S. Application Data

[63] Continuation of Ser. No. 723,218, Jun. 28, 1991, abandoned.

[30] Foreign Application Priority Data

Jun. 29, 1990 [JP] Japan .................. 2-173805

[51] Int. Cl.⁵ .................. H01L 29/04; H01L 29/78
[52] U.S. Cl. .................. 257/67; 257/369; 257/393; 257/903
[58] Field of Search .................. 357/59 F, 71 P, 51, 357/23.7, 42

[56] References Cited

U.S. PATENT DOCUMENTS

| | | | |
|---|---|---|---|
| 4,453,175 | 6/1984 | Ariizumi et al. | 357/59 F |
| 4,774,203 | 9/1988 | Ikeda et al. | 357/59 F |
| 4,792,841 | 12/1988 | Nagasawa et al. | 357/51 |
| 4,984,200 | 1/1991 | Saitoo | 365/154 |
| 5,057,898 | 10/1991 | Adan et al. | 357/42 |

FOREIGN PATENT DOCUMENTS 0365690 5/1990 European Pat. Off. .
0420646 4/1991 European Pat. Off. .

OTHER PUBLICATIONS

Patent Abstracts of Japan, vol. 13, No. 404 (E-817) Sep. 7, 1989 and JP-A01 144 655, Jun. 6, 1989.
Patent Abstracts of Japan, vol. 13, No. 404 (E-817) Sep. 7, 1989 and JP-A-1144674 (Hitachi) Jun. 6, 1989.
Pat. Abs. of Japan, vol. 13, No. 433 (E-824) Sep. 27, 1989 and JP-A-1161860 (Hitachi) Jun. 26, 1989.
Int'l Electron Devices Meeting, Dec. 1888, San Francisco, Calif., pp. 48-51; T. Yamanaka et al.: 'A 25 UM2 New Poli-Si PMOS Load (PPL) SRAM Cell Having Excellent Soft Error Immunity'.

Primary Examiner—Rolf Hille
Assistant Examiner—Robert Limanek
Attorney, Agent, or Firm—Nixon & Vanderhye

[57] ABSTRACT

A static RAM cell including first and second bulk transistors having gate electrodes extended over an element isolation region and forming a flip-flop, third and fourth bulk transistors having source and drain regions and formed adjacently to the element isolation region, a first conductive strap layer for self-aligning the gate electrode of the first bulk transistor with the source or drain region of the third bulk transistor, and a second conductive strap layer for self-aligning the gate electrode of the second bulk transistor with the source or drain region of the fourth bulk transistor.

4 Claims, 9 Drawing Sheets

STATIC RAM CELL WITH CONDUCTIVE STRAPS FORMED INTEGRALLY WITH THIN FILM TRANSISTOR GATES

This is a continuation of application Ser. No. 07/723,218, filed Jun. 28, 1991, now abandoned.

BACKGROUND OF THE INVENTION

1. Field of the Invention

The present invention relates to a static RAM cell, and more particularly to a structure in which loads are connected with transistors forming a flip-flop as a storage element.

2. Description of the Prior Art

Figure 4:
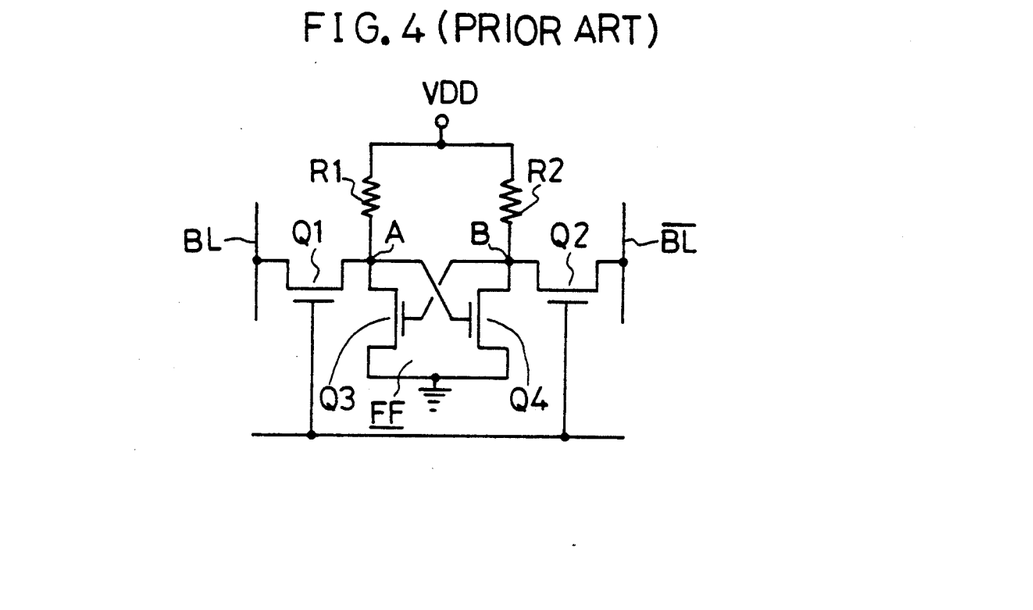
FIG. 4 is an equivalent electric circuit diagram according to the prior art.
Figure 5:
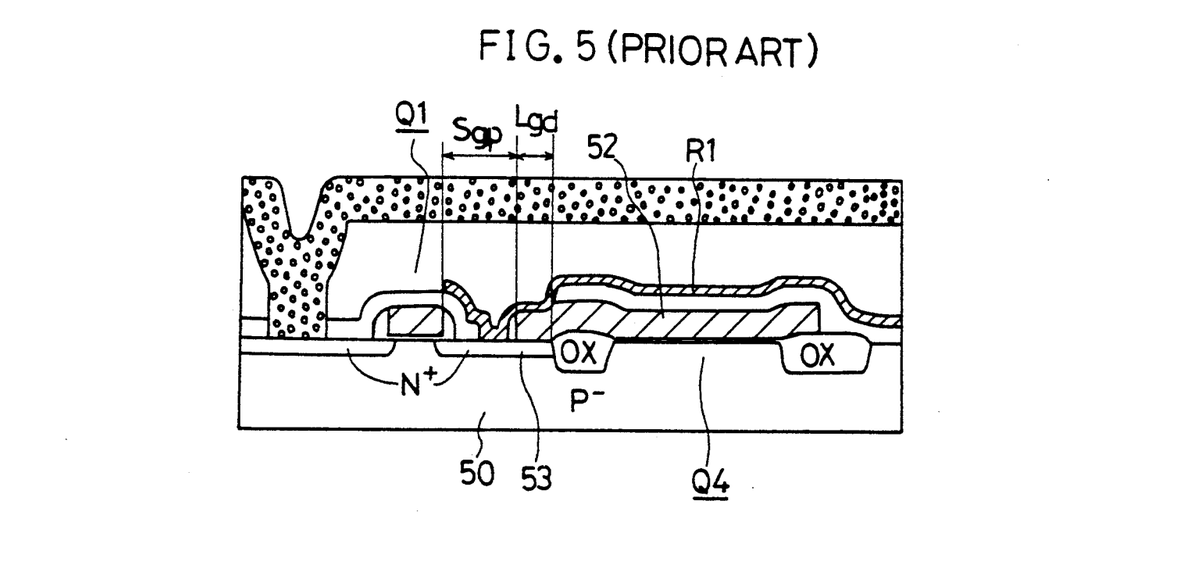
FIG. 5 is a longitudinal section view showing a main portion of the structure according to the prior art.

Referring to a conventional static RAM cell, a storage element is a flip-flop which is formed by two cross-connected inverters. It is necessary to greatly reduce a cell size of the storage element in the high density static RAM cell. FIGS. 4 and 5 show an electric circuit and a structure of the conventional high density static RAM cell which is manufactured by a MOS technology.

The static RAM cell comprises four N-channel bulk transistors and two high value polysilicon resistances. In FIGS. 4 and 5, access transistors Q1 and Q2 connect nodes A and B of a storage element cell with bit lines BL and $\overline{BL}$, respectively.

A flip-flop FF includes transistors Q3 and Q4, and load resistances R1 and R2. The transistors Q1, Q2, Q3 and Q4 are formed as bulk elements on a semiconductor substrate by the MOS technology. To save space and make density high, the load resistances R1 and R2 are formed on a polysilicon layer which is deposited on the bulk elements.

As shown in FIG. 5, a $P^-$-type silicon substrate is indicated at 50, an element isolation region is indicated at OX, a polysilicon gate electrode of the access transistor Q1 is indicated at 51, a polysilicon gate electrode of the transistor Q4 is indicated at 52, and a drain region of the transistor Q1 is indicated at 53.

Figure 6:
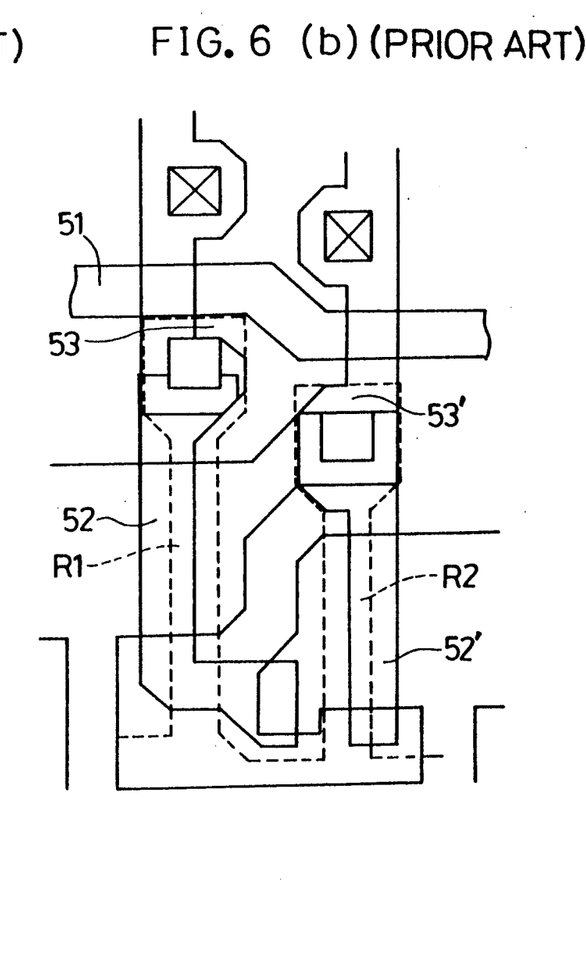

FIG. 6 is a plan view showing the typical arrangement of a memory cell having the above-mentioned structure.

As shown in FIG. 6 (a), an active region 54 is formed, and a first polysilicon layer is then deposited and patterned. Consequently, the gates 51, 52 and 52' are formed. Prior to the deposition of the first polysilicon layer, connection windows 55 and 55' are provided on a gate oxide film of the drain regions 53 and 53'. Thus, the so-called buried connection can be obtained. Accordingly, the gate electrodes 52 and 52' are respectively extended over the drain regions of the N-channel bulk transistors Q1 and Q2 beyond the element isolation region OX by patterning the first polysilicon layer. Consequently, the gate electrodes 52 and 52' are directly connected with the drain regions 53 and 53'.

As shown in FIG. 6 (b), a second polysilicon layer is deposited on the gate electrodes 52 and 52' through an insulating film and is then patterned, so that the load resistances R1 and R2 are formed.

With the above-mentioned structure, the cell size is increased for the following reasons.

1. The buried connection is formed by the first polysilicon layer. Consequently, there is a minimum spacing, designated as Sgp in FIG. 5 and FIG. 6 (a), determined by photoetching resolution.

2. The buried connection needs a minimum overlap of the first polysilicon gate electrode to the drain regions, indicated as Lgd in FIG. 5.

The foregoing occurs depending on accuracy in a photolithographic process.

3. To obtain the buried connection, the connection windows are provided on the gate oxide film before the polysilicon is deposited. As a result, the gate oxide film is deteriorated.

SUMMARY OF THE INVENTION

In consideration of the foregoing, it is an object of the present invention to provide a static RAM cell wherein gate electrode connection of bulk transistors forming a flip-flop as storage element are self-aligned with drain or source region of cross-connected transistors in place of buried connection so that a cell size can be reduced.

The present invention provides a static RAM cell comprising first and second bulk transistors having gate electrodes extended over an element isolation region and forming a flip-flop, third and fourth bulk transistors having source and drain regions and formed adjacently to the element isolation region, a first conductive strap layer for self-aligning the gate electrode of the first bulk transistor with the source or drain region of the third bulk transistor connection, and a second conductive strap layer for self-aligning the gate electrode of the second bulk transistor with the source or drain region of the fourth bulk transistor connection.

BRIEF DESCRIPTION OF THE DRAWINGS

FIGS. 2 (a) to (d) are plan views showing the schematic pattern structure at the time of cell formation;

FIGS. 3 (a) to (g) are views showing manufacturing steps according to the embodiment of the present invention;

FIGS. 6 (a) and (b) are plan views showing the schematic pattern structure at the time of cell formation according to the prior art.

DETAILED DESCRIPTION OF A PREFERRED EMBODIMENT

According to the present invention, the gate electrodes of the bulk transistors may be formed by polysilicon.

The first and second conductive strap layers may be formed by polysilicon or polycide which is obtained by laminating silicide on polysilicon.

With the cell structure of the present invention, the gate electrode of the first bulk transistor is self-aligned with the source or drain region of the third bulk transistor by the first conductive strap layer. In addition, the gate electrode of the second bulk transistor is self-aligned with the source or drain region of the fourth bulk transistor by the second conductive strap layer. Consequently, there can be reduced an area which is required to connect the gate electrode with the source or drain region (diffusion region). Thus, the cell size can be reduced.

A preferred embodiment of the present invention will be described in detail with reference to the drawings.

The present invention is not limited to the following embodiment.

Figure 1:
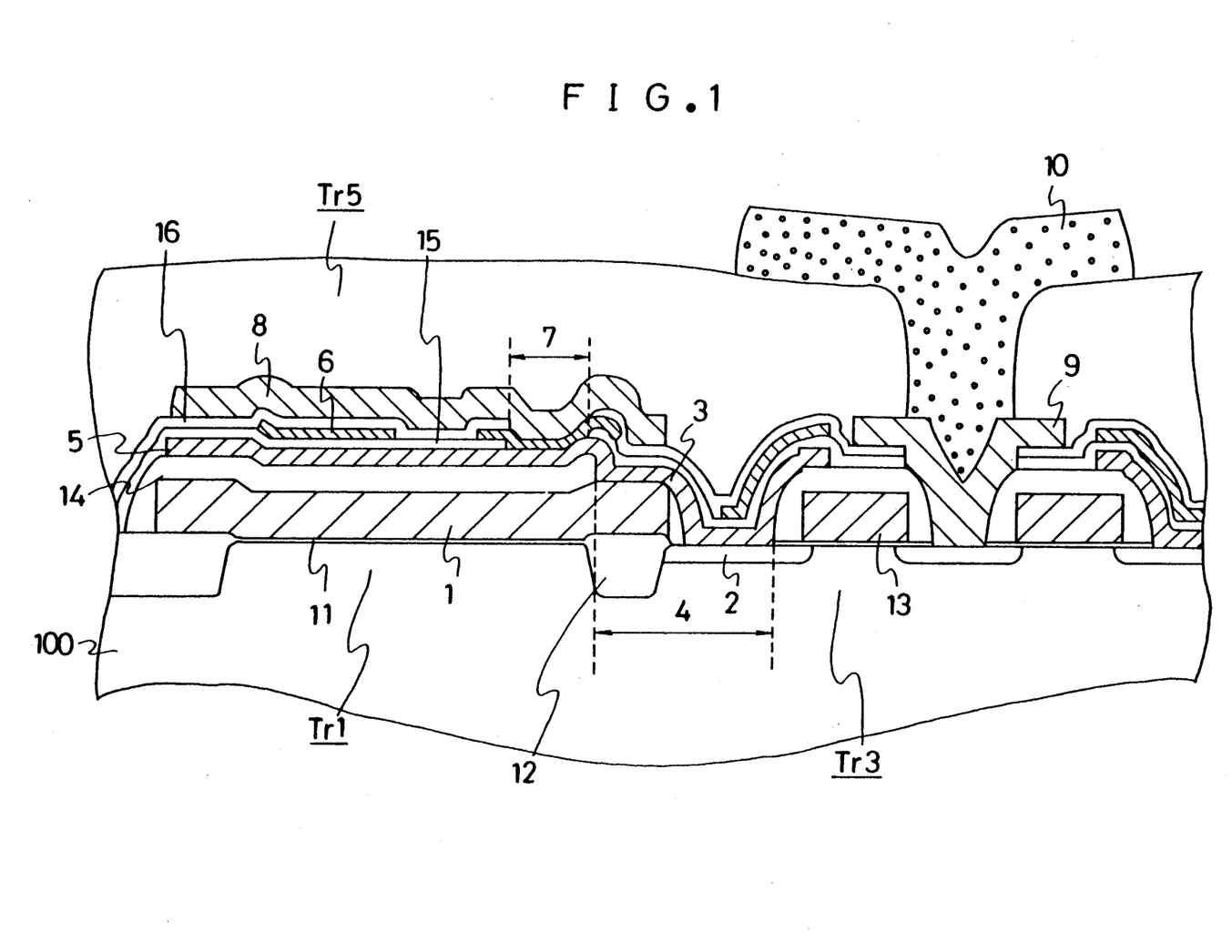
FIG. 1 is a longitudinal section view of a main portion according to an embodiment of the present invention.

FIG. 1 is a longitudinal section view of a static RAM cell showing the structure of a first conductive strap layer 3, and first and third N-channel bulk transistors Tr1 and Tr3 which are formed on a semiconductor substrate 100. The illustrated first and third bulk transistors Tr1 and Tr3 and the first conductive strap layer 3 is also illustrative of the structure of second and fourth bulk transistors Tr2 and Tr4 and a second conductive strap layer 3', respectively. Accordingly, the structure of the second and fourth bulk transistors Tr2 and Tr4 and the second conductive strap layer 3' is not shown in FIG. 1.

Figure 2:
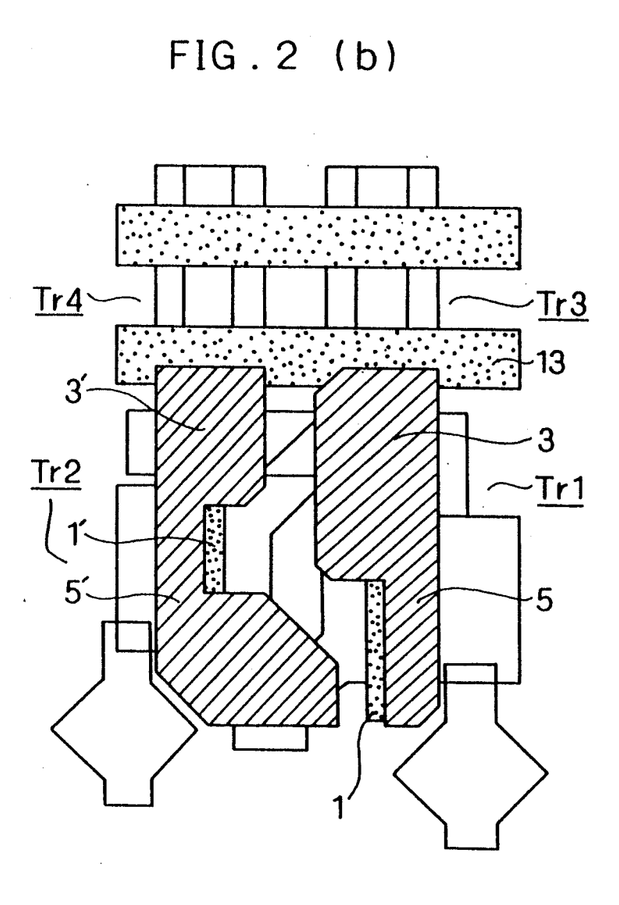

FIGS. 2 (a) to (d) are plan views showing the schematic structure at the time of cell formation.

The first and second bulk transistors Tr1 and Tr2 conventionally form a flip-flop.

Referring to FIGS. 1 and 2, a gate electrode of the first bulk transistor Tr1 is indicated at 1. The gate electrode 1 is formed by depositing polysilicon on a gate oxide film 11 provided on the semiconductor substrate 100 and then patterning the same. Indicated at 12 is an element isolation region over which the gate electrode 1 is extended.

Formed adjacently to the element isolation region 12 is a drain region 2 which is a diffusion region of the third bulk transistor Tr3. A gate electrode of the third bulk transistor Tr3 is indicated at 13.

The first conductive strap layer is indicated at 3. The first conductive strap layer 3 is formed on the gate electrode 1 through an opening in the insulating film 14, and on the drain region 2. The insulating film 14 is not formed in a shoulder portion of the gate electrode 1 on the element isolation region 12. Consequently, the gate electrode 1 is self-aligned with the drain region 2 through the first conductive strap layer 3. In this case, a strap connection area is indicated at 4. The first conductive strap layer 3 functions as a lower gate electrode 5 of a PMOS thin film transistor Tr5. The PMOS thin film transistor Tr5 is a load of the flip-flop to be described below.

The thin film transistor Tr5 includes the lower gate electrode 5, a thin film transistor body 6, a connection pad 7 for stacked connection and an upper gate electrode 8. The thin film transistor body 6 is formed above the lower gate electrode 5 through an insulating film 15. The connection pad 7 is connected with the lower gate electrode 5 through an opening provided on the insulating film 15. The upper gate electrode 8 is insulated from the thin film transistor body 6 through an insulating film 16 and is connected with the connection pad 7.

A connection pad for a metallic wire 10 is indicated at 9. The connection pad 9 is formed so as to be connected with a source region of the third bulk transistor Tr3.

There will be described manufacturing steps according to the embodiment with reference to FIG. 3.

Figure 3A:
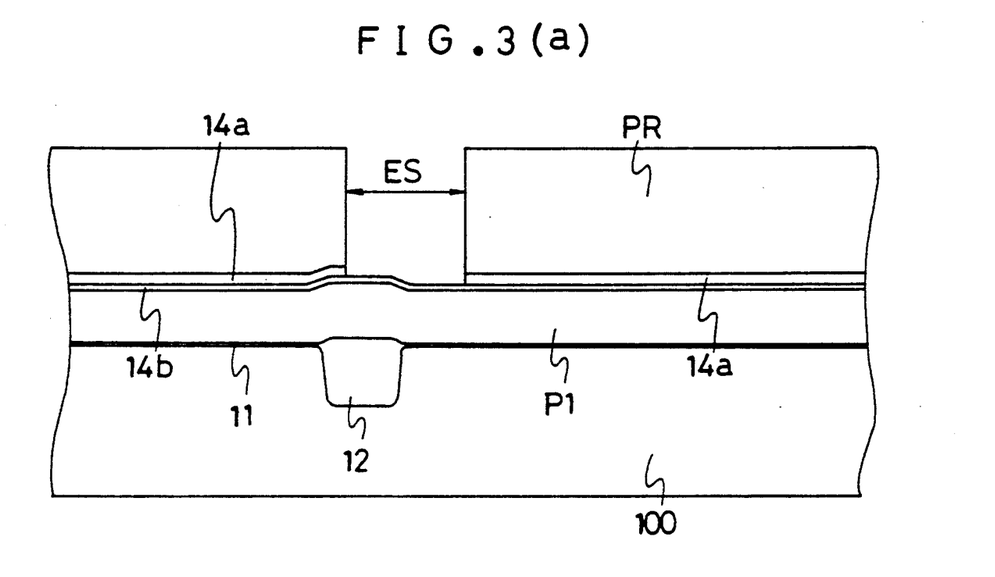
Figure 3B:
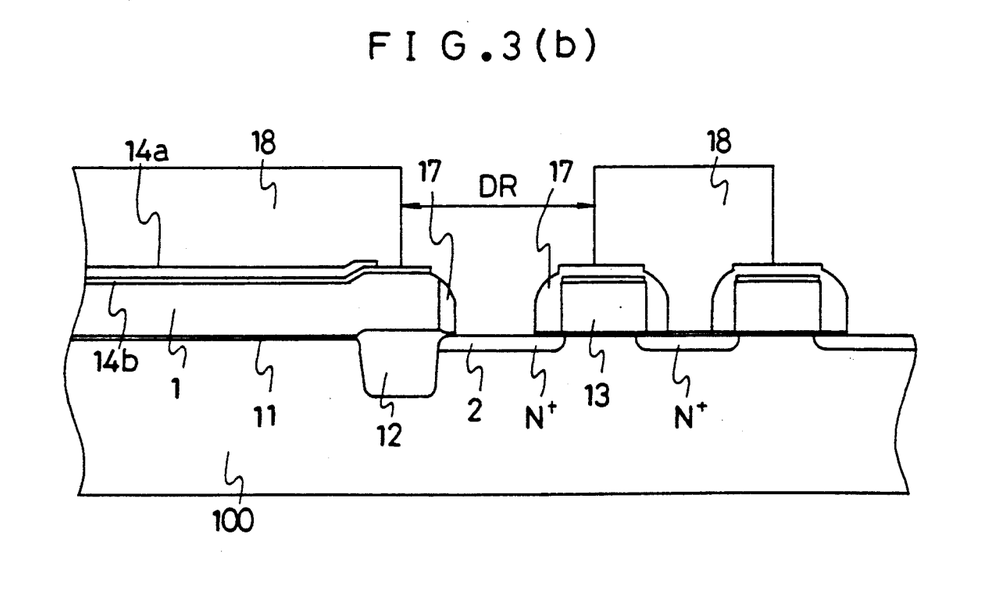

In succession to MOS technical processing, an active region and the element isolation region 12 are first formed on the semiconductor substrate 100. Then, the gate oxide film (SiO₂) 11 is thermally grown on the active region. A first polysilicon layer P1 is deposited and doped on the gate oxide film 11 in order to form the gate electrode of the bulk transistor. Sequentially deposited on the first polysilicon layer P1 are an oxidation interrupting layer 14b such as LPCVD-SiN and an insulating CVD oxide film 14a comprised of NSG. Photoresist PR is applied on the insulating CVD oxide film 14a to be exposed by a predetermined mask. A connection window ES is provided on the insulating CVD oxide film 14a. On the other hand, the oxidation interrupting layer 14b should not be removed during etching because it prevents the polysilicon layer P1 from being oxidized [FIG. 3 (a)].

As shown in FIG. 3 (b), the first polysilicon layer P1 is patterned by photolithographic and etching steps so that gate electrodes 1 and 13 are formed [FIG. 2 (a)]. Then, ion implantation is carried out in order to form an LDD structure by using the gate electrodes 1 and 13 as masks. More specifically, side walls 17 are formed on the gate electrodes 1 and 13 by using a CVD oxide film. The source and drain region 2 is then formed by ion implantation. In consideration of the strap connection, the residual thin oxide film on the source and drain regions is removed by a new mask 18 having an opening DR.

Figure 3C:
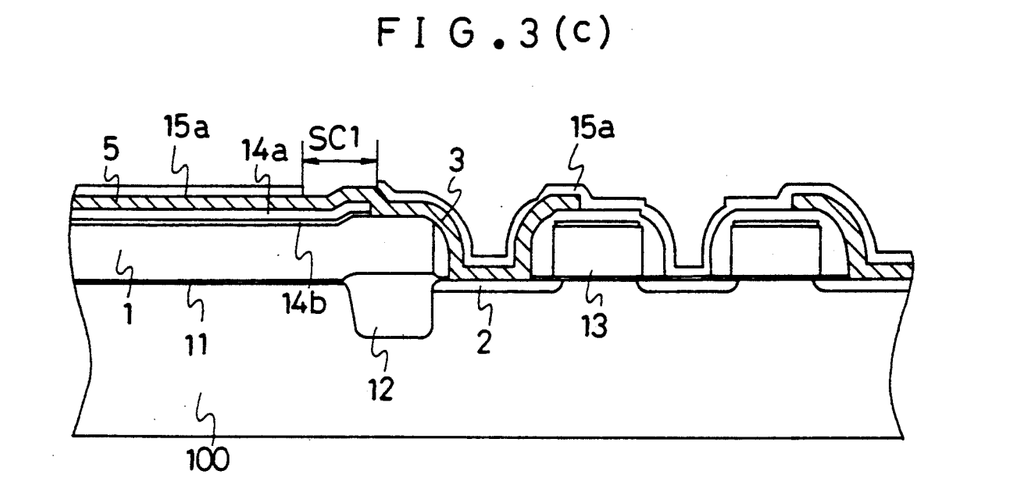
Figure 3D:
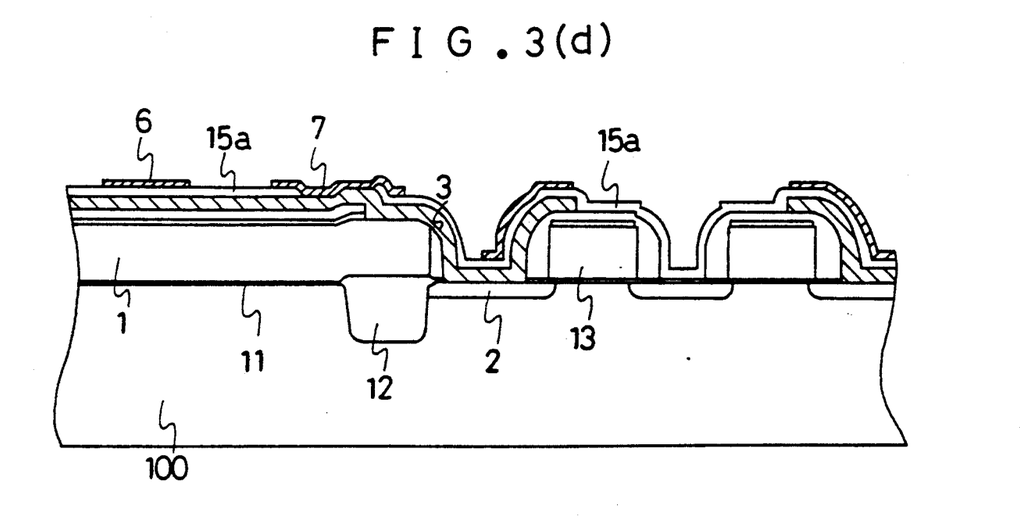
Figure 3E:
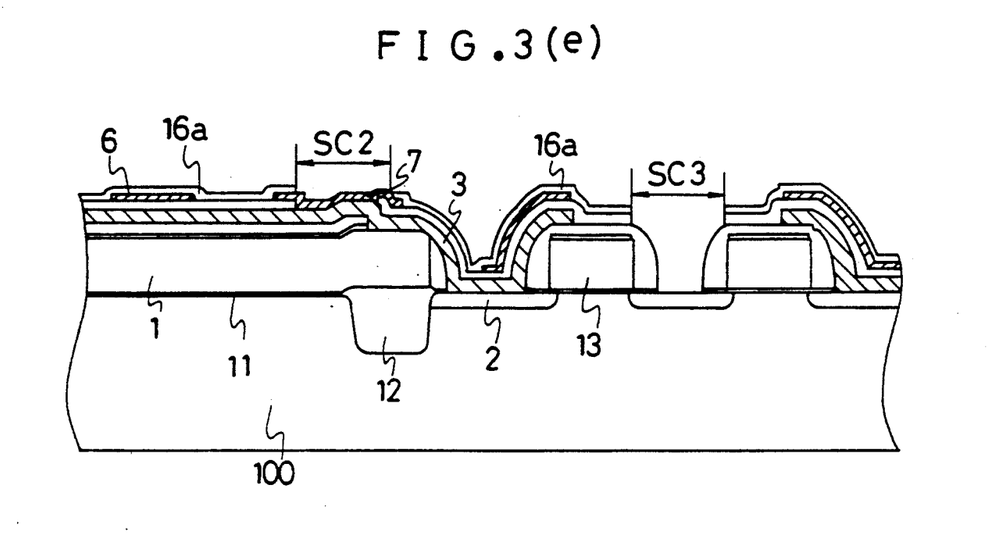
Figure 3F:
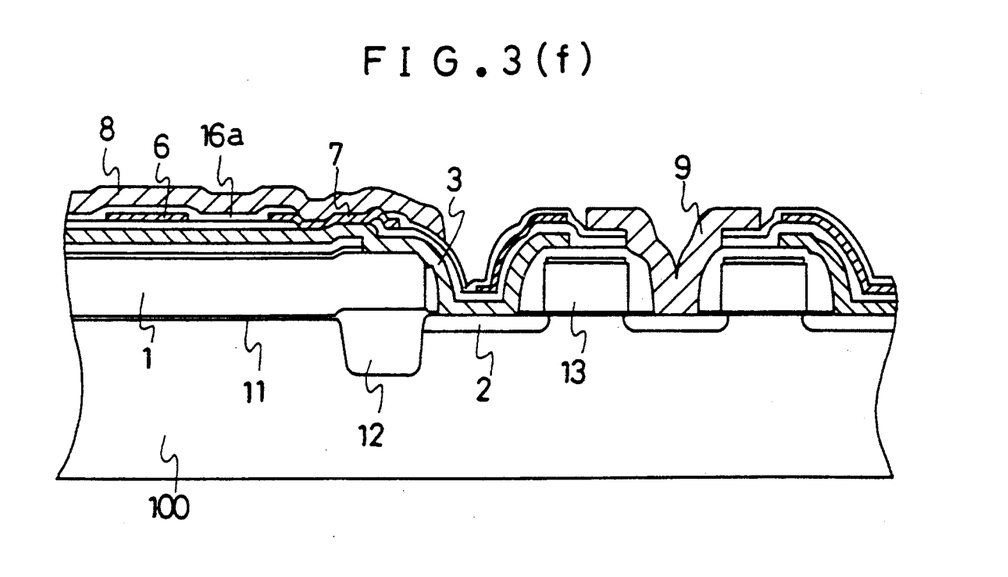
Figure 3G:
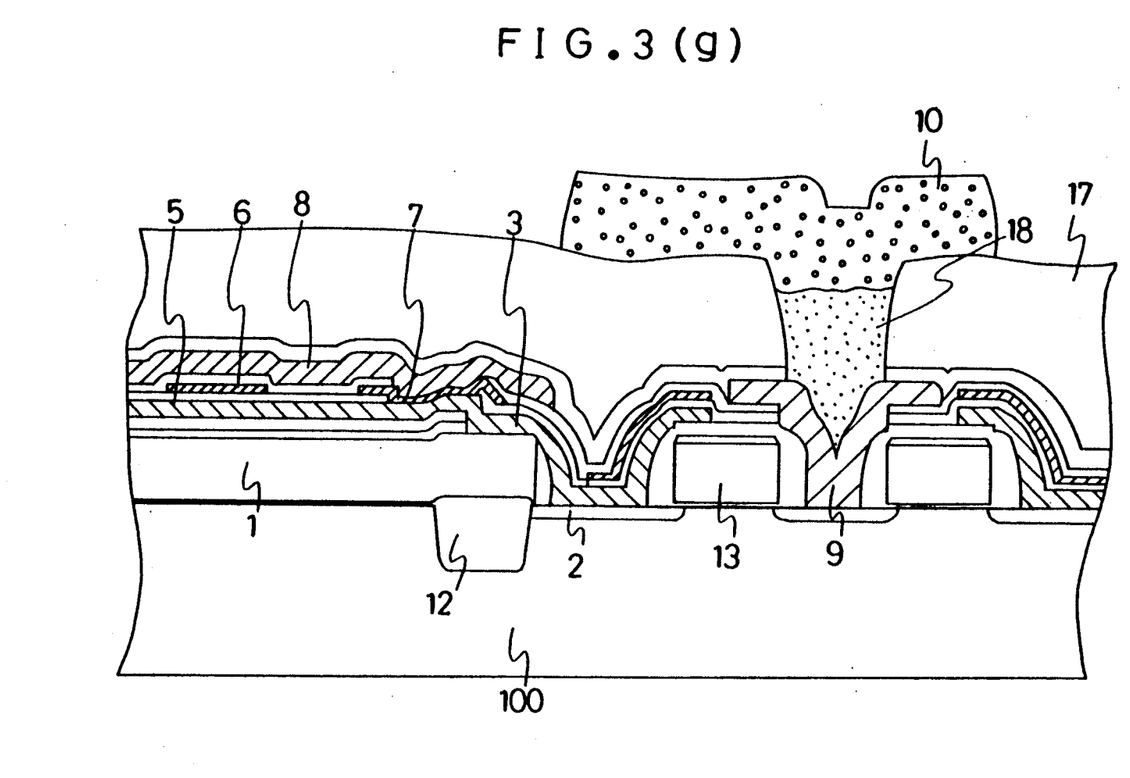

After the mask 18 is removed, the oxidation interrupting layer 14b on the gate electrode 1 is etched off. Then, polycide is deposited and patterned in order to form the first and second conductive strap layers. Consequently, there is formed the first conductive strap layer 3 (second conductive strap layer 3') which connects the gate electrode 1 with the drain region 2 [FIG. 2 (b)]. The conductive strap layer may be formed of a metal such as WSi or TiSi. A CVD oxide film layer 15a is deposited as a lower gate insulating layer of the thin film transistor Tr5 over the whole surface so that a connection window SC1 for the connection pad 7 is provided [FIG. 3 (c)].

Then, a third polysilicon layer is deposited and patterned on the CVD oxide film layer 15a in order to form the thin film transistor body [FIG. 2 (c)]. Consequently, the thin film transistor body 6 and the connection pad 7 are formed [FIG. 3 (d)]. As may be seen from a consideration of FIGS. 2(c) and 3(d), the latter is a sectional view of FIG. 2(c).

As shown in FIG. 3 (e), a second CVD oxide film layer 16a is deposited as the upper gate insulating layer of the thin film transistor. A second connection window SC2 is provided on the connection pad 7. In addition, a connection window SC3 for the connection pad 9 is provided on the source region of the third bulk transistor Tr3.

As shown in FIG. 3 (f), a fourth polysilicon layer is deposited and patterned on the second CVD oxide film layer 16a in order to form the upper gate electrode 8 and connection pad 9 of the thin film transistor. Then, boron ions are implanted in the thin film transistor body 6 by using the upper gate electrode 8 as a self-aligning mask. Consequently, the source and drain regions of the thin film transistor are formed.

As shown in FIG. 3 (g), NSG and BPSG are continuously deposited over the whole surface of a cell, and is then flattened by a reflow method. Consequently, an insulating film 17 is formed. Thereafter, the insulating film on the connection pad 9 is removed by etching. A tungsten (w) plug 18 is embedded and a metal 10 is then deposited. Consequently, a metallic interconnection layer is formed.

According to the present invention, the gate electrodes of the first and second bulk transistors are self-aligned with the source or drain region of the third and fourth bulk transistors through the first and second conductive strap layers, respectively. Consequently, a memory cell area can be reduced.

After the gate electrodes of the bulk transistors are patterned, the self-aligning is carried out. Accordingly, the gate oxide film is not deteriorated.

In the case where the thin film transistor is the load of the flip-flop, the conductive strap layer is additionally used as (i) the thin film transistor bottom gate electrode and (ii) contact pad for stacked contacts in the thin film transistor. Consequently, a process can be simplified.

Furthermore, gate electrodes of bulk transistors can be of simple and rectangular shape, this results in easier and more precise photoetching patterning, and better reproducibility of device characteristics.

What is claimed is:

1. A static RAM cell comprising a flip-flop circuit having two inverters connected to each other, and two access transistors for connecting nodes of said flip-flop circuit to bit lines;

wherein said inverters are formed on a semiconductor substrate and comprise first and second bulk transistors respectively having gate electrodes extending to a device isolating region, and thin film transistors having gate electrodes, said thin film transistors being formed on said first and second bulk transistors;

wherein said access transistors comprise third and fourth bulk transistors having source/drain regions formed adjacent said device isolating region; and wherein said gate electrodes of said first and second bulk transistors are connected to said source/drain regions of said third and fourth bulk transistor, respectively through first and second conductive strap layers, said first and second conductive strap layers being formed integrally with the gate electrodes of said thin film transistors.

2. A static RAM cell according to claim 1, wherein the first and second conductive strap layers formed by polysilicon or polycide which is obtained by laminating silicide on polysilicon.

3. A static RAM cell according to claim 1, wherein the respective bulk transistors have gate electrodes formed by polysilicon.

4. A static RAM cell as in claim 1 wherein said thin film transistors are of a double insulated gate construction and each of said conductive strap layers forms an electrode of one of said thin film transistors.

* * * * *